United States Patent [19]

Weigel et al.

[11] Patent Number: 5,576,074
[45] Date of Patent: Nov. 19, 1996

[54] LASER WRITE PROCESS FOR MAKING A CONDUCTIVE METAL CIRCUIT

[75] Inventors: David C. Weigel, White Bear Lake; David A. Morgan, Stillwater, both of Minn.

[73] Assignee: Minnesota Mining and Manufacturing Company, St. Paul, Minn.

[21] Appl. No.: 518,547

[22] Filed: Aug. 23, 1995

[51] Int. Cl.⁶ .................. B05D 3/06; B05D 3/02
[52] U.S. Cl. .............. 427/559; 427/557; 427/555; 427/226; 427/227; 430/198; 430/200; 430/291; 430/311
[58] Field of Search .................. 427/559, 556, 427/557, 229, 226, 227, 555, 554, 558; 430/198, 200, 269, 291, 311

[56] References Cited

U.S. PATENT DOCUMENTS

| | | | |
|---|---|---|---|
| 2,759,019 | 8/1956 | Brown et al. | 260/556 |
| 2,764,602 | 9/1956 | Ahlbrecht | 260/404.5 |
| 3,194,805 | 7/1965 | Brooker et al. | 260/240 |
| 3,236,707 | 2/1966 | Lins | 427/557 |
| 3,260,612 | 7/1966 | Dulmage et al. | 427/557 |
| 3,360,367 | 12/1967 | Stricklin | 96/1 |
| 3,445,654 | 5/1969 | Loprest | 427/557 |
| 3,451,813 | 6/1969 | Kinney et al. | 96/36.2 |
| 3,589,906 | 6/1971 | McDowell | 96/87 |
| 3,666,478 | 5/1972 | Groh et al. | 96/114.5 |
| 3,884,699 | 5/1975 | Cavallo et al. | 96/87 |
| 3,941,596 | 3/1976 | Heiart | 156/234 |
| 4,273,842 | 6/1981 | Nonogaki et al. | 427/558 |
| 4,454,168 | 6/1984 | Fritz | 427/96 |
| 4,526,807 | 7/1985 | Auerbach | 427/53.1 |
| 4,578,155 | 3/1986 | Halliwell et al. | 204/15 |
| 4,608,329 | 8/1986 | Geisler | 430/110 |
| 4,619,892 | 10/1986 | Simpson et al. | 430/505 |
| 4,636,403 | 1/1987 | Fisanick et al. | 427/53.1 |
| 4,683,101 | 7/1987 | Geisler | 430/291 |
| 4,701,019 | 10/1987 | Fitzpatrick | 427/559 |
| 4,710,253 | 12/1987 | Soszek | 156/272.8 |
| 4,755,396 | 7/1988 | Geisler et al. | 237/197 |
| 4,769,399 | 9/1988 | Schenz | 523/213 |
| 4,784,933 | 11/1988 | Kanada et al. | 430/204 |
| 4,822,451 | 4/1989 | Ouderkirk et al. | 156/643 |
| 4,879,176 | 11/1989 | Ouderkirk et al. | 428/323 |
| 4,916,115 | 4/1990 | Mantese et al. | 427/566 |
| 4,968,578 | 11/1990 | Light et al. | 430/126 |
| 5,001,012 | 3/1991 | Sarkar et al. | 428/447 |
| 5,013,622 | 5/1991 | Simpson et al. | 430/550 |
| 5,041,550 | 8/1991 | Lea et al. | 548/219 |
| 5,047,283 | 9/1991 | Leatherman et al. | 428/209 |
| 5,192,581 | 3/1993 | Hirsch et al. | 427/556 |
| 5,245,045 | 9/1993 | Hall et al. | 548/365.1 |
| 5,250,394 | 10/1993 | Wei | 430/313 |
| 5,286,604 | 2/1994 | Simmons, III | 430/286 |
| 5,340,617 | 8/1994 | Fasano et al. | 427/466 |
| 5,378,508 | 1/1995 | Castro et al. | 427/556 |

FOREIGN PATENT DOCUMENTS

| | | |
|---|---|---|
| 0250248 | 6/1987 | European Pat. Off. . |
| 2025688 | of 0000 | France . |

*Primary Examiner*—Marianne Padgett
*Attorney, Agent, or Firm*—Gary L. Griswold; Walter N. Kirn; Arlene K. Musser

[57] ABSTRACT

A process is described for providing a conductive metal circuit using a coherent radiation source. The circuit pattern is directly written onto a laser addressable element having a supercooling material layer. A conductive metal toner is then applied to the light struck areas and fired in a furnace to provide a conductive metal circuit.

10 Claims, No Drawings

5,576,074

LASER WRITE PROCESS FOR MAKING A CONDUCTIVE METAL CIRCUIT

FIELD OF THE INVENTION

The present invention relates to a process for forming a conductive metal circuit in the fabrication of printed circuit boards, and particularly to a process using coherent radiation such as lasers or light emitting diodes in combination with an element having a supercooled material layer.

BACKGROUND OF THE ART

The fabrication of printed circuit boards using deposition of conductive metals is well known in the art. Methods for depositing the conductive metals include vapor deposition, electrodeposition, electroless deposition, and sputtering. Once a uniform layer of metal is deposited onto a substrate, then the circuit is formed by subtractive imaging which etches the unwanted metal away from the metallized surface. In a subtractive imaging process, a conductive metal is first deposited over the entire surface of the substrate, a photoresist is then coated and dried on the metal surface, followed by imaging and development of the image. The exposed metal is etched away using a etching solution and the remaining photoresist is removed from the metallic image. This process is very time consuming and wasteful of materials. In addition, the disposal of the developing solutions and/or etching solutions used in the process creates environmental concerns.

Alternatively, the metal may be deposited as a positive image. The most common method for forming a positive image is screen printing using a metallic conductive ink. A typical metallic ink contains a conductive metal dispersed in a binder and a solvent. The positive image is formed by screen printing the metallic ink onto a substrate followed by removal of the solvent. When possible, the imaged substrate is then subjected to high temperatures to volatilize the residual binder. If the residual binder is not removed, then the binder may interfere with the conductivity of the metal image. Even though the process steps of a positive imaging method are fewer than those of the subtractive method, the screen printing method has limited resolution. In addition, the screen printing method requires the removal of solvents which is again an environmental concern.

There have been many attempts to improve the productivity of the process by using lasers to deposit the conductive metal onto a substrate. For example, U.S. Pat. No. 5,378,508 discloses a method for providing a conductive metal deposit on a substrate by applying a metallic salt composition onto a substrate and then imaging the composition using a coherent radiation source. The radiation reduces the metal salt in the presence of an amine or amide compound to form a metallic image. The imaged substrate is then washed and dried to remove the non-imaged areas, thus requiring disposal of the washing solvent. The choice of useful metallic salts are also limited due to potential contamination by the anion.

U.S. Pat. No. 4,710,253 describes a circuit board which is manufactured by using a heat actuable adhesive in combination with a conductive powder. The conductive powder is applied over the surface of the adhesive and imaged using a coherent light source. In the light struck areas, the adhesive becomes tacky and the conductive powder adheres to the tackified adhesive. The excess metallic powder is brushed away. The imaged substrate is then fired to remove the adhesive and to fuse the metal to the substrate. The metallic powder necessarily has to be in contact with the adhesive during the imaging process due to the loss of adhesive tack after the imaging process. Since the metallic powder must be in contact with the adhesive during the imaging process, the image may become distorted due to the interference of the laser beam by the metallic powder. In addition, the metallic powder must be applied over the entire surface of the adhesive leading to excessive waste of materials.

U.S. Pat. No. 4,636,403 describes a process for repairing defects in a metal pattern of a photomask by coating the surface of the photomask with a metal-organic layer and then exposing the layer with a laser beam in the area of the defect to adhere the metal-organic layer to the defect area. The unexposed metal-organic layer is removed with a solvent.

U.S. Pat. No. 4,578,155 describes a process using a laser to locally plate a metal onto a surface without the need for an electrical potential being applied to the polymeric workpiece. The workpiece is placed in an electroplating solution and the laser is directed through the solution onto the polymer surface causing plating in the light struck areas.

U.S. Pat. No. 4,526,807 describes a process for forming conductive metal lines using a coherent radiation source. A solution containing a reducible metal or metalloid compound in an oxidizable organic matrix is solvent coated onto a substrate. An imagewise pattern is then directly written onto the coated layer using a laser beam. The metal or metalloid compound is reduced to conductive metal in the light struck areas.

U.S. Pat. No. 3,451,813 describes a process is using a high intensity flash lamp to expose a photosensitive layer containing a reducible metal or metalloid compound. The photosensitive layer is applied to the substrate in a pattern and then exposed to form a conductive metal pattern. Even though this process does not require the use of etchants or wet processing chemicals, the resolution is limited by the methods used to apply a patterned photosensitive layer on the substrate.

U.S. Pat. No. 3,941,596 describes an imaging process that uses a radiation-sensitive or heat-sensitive layer which becomes tacky or fluid upon exposure to radiation. An image is formed by the application of a dry or liquid toner to the exposed areas of the layer. The conventional method for forming images with these materials is by using a thermal printhead. However, in U.S. patent application Ser. No. 08/319,934, a recording medium having a radiation-sensitive layer is described which is addressable by an infrared laser. U.S. Pat. No 5,286,604 also discloses a photothermo-tackifiable composition which is addressable by lasers. In each of these systems, the materials are used as a recording medium. There is no disclosure of their use as a means for providing a conductive metallic image on a printed circuit board.

The printed circuit board manufacturing methods to date suffer from either excessive process times, limitation of useful available materials, limited resolution, or waste of materials; therefore, there is a need for a more productive and efficient process of providing a conductive metallic image on a circuit board. In particular, there is a need for a method compatible with a laser addressable system to allow for automation and high resolution.

SUMMARY OF THE INVENTION

The present invention provides a process for forming a conductive metallic image on a substrate using a coherent radiation source. The use of the coherent radiation source provides flexibility in designing an automated process for fabrication of printed circuit boards. The following process steps are performed in the order listed: i) providing a laser addressable element comprising a substrate having on at least one surface thereof a non-metallic layer comprising a) a solid binder which can be converted to a supercooled liquid upon exposure with a coherent radiation source and subsequent cooling to room temperature, b) a radiation absorbing dye capable of converting radiation from the coherent radiation source to heat, and c) an optional fluorinated surfactant; ii) exposing the laser addressable element with the coherent radiation source to form an imagewise pattern; iii) applying to the imagewise pattern a metallic toner comprising a conductive metal; and iv) heating the laser addressable element to remove a substantial amount of the non-metallic layer and to fuse the conductive metal.

DETAILED DESCRIPTION OF THE INVENTION

A process for forming a conductive metallic image on a substrate is provided which uses a coherent radiation source. A laser addressable element is directly exposed in a imagewise pattern using a coherent radiation source, preferably an infrared source. The imagewise pattern corresponds to the desired pattern of the printed circuit. The exposed areas become supercooled and receptive to a conductive metallic toner, where the non-imaged areas are not receptive to the toner. A conductive metallic toner is applied to the exposed areas, thus creating a visible image in the supercooled areas. The toner may be a dry powder or a liquid toner. The imaged element is then heated to remove a substantial amount of the non-metallic materials and to fuse the remaining metal, thus leaving a conductive metal image (i.e., a circuit pattern) on the substrate.

A preferred laser addressable element for use in the present invention is described in U.S. patent application Ser. No. 08/319934, incorporated herein by reference. The element comprises a substrate upon which is coated a non-metallic supercooled material comprising a solid binder capable of being converted to a supercooled liquid upon heating and subsequent cooling to room temperature, an infrared absorbing dye, and an optional fluorinated surfactant.

The substrate may be any material having a thermal stability above 700° C. and preferably above 900° C. Particularly useful materials include ceramics, such as alumina, barium titanate, silicon carbide, and ceramic greenware; glass; and silicon wafers.

A "supercooled material" is defined as a material capable of existing in a supercooled state after melting and subsequent cooling. Preferably the material has a melting temperature about 10° C. above the temperature of the environment where the imaging process is to be conducted (i.e., 10° C. above a room temperature of about 19° C. to 20° C.). The material must also form a supercooled melt when cooled to a temperature below its melting temperature. The supercooled melt is believed to be a temporary fluid metastable liquid state to which a conductive metallic toner will absorb or adhere. Once the supercooled melt returns to the solid state, then the toners no longer will be absorbed or adhered to the material. In other words, a distinguishable image area will no longer exist on the surface of the material.

Preferably, the supercooled material melts within the approximate range of 40° C. to 140° C. Due to the lack of available chemical literature defining supercooled materials, the following tests were designed for determining whether a material is useful as a supercooled material in the practice of the present invention.

The melting point or melting range of the supercooled material is determined by placing a small amount of the material in powder form on a glass microscope slide, covering the sample with a cover glass, heating the material on a microscope having a hot state which is provided with temperature measuring means, and observing the temperature at which the particles melt and fuse.

A test for determining if a material is a supercooling material suitable for this invention is conveniently accomplished using the same sample as for the melting point test. A Leitz hot stage microscope having an electrically heated stage which may be cooled by circulation of cold water is used for both determinations. After the stage has been heated above the melting point of the sample, it is cooled and the temperature noted at which crystallization or solidification occurs. Both heating and cooling may be accomplished at somewhat higher rates of temperature change than are ordinarily specified where more precise measurements are required. Materials which when thus treated remain liquid to a temperature well below their melting points, e.g., at least about 60° C. below their melting points, have been found to be effective as supercooling materials for this invention; materials which crystallize or solidify at or near their melting points should not be used for making powder-retaining latent images in accordance with this invention. Some materials solidify to a glassy rather than a visibly crystalline state, a condition which is easily determined by applying moderate pressure on the cover glass with a spatula; glassy droplets retain their shape, whereas the liquid droplets flow or rapidly crystallize. A more elaborate test for determination of supercooling materials suitable for this invention is described in U.S. Pat. No. 3,360,367, incorporated herein by reference.

A number of supercooling materials are useful in the non-metallic coatings of the invention. Representative examples of these materials include dicyclohexyl phthalate, dichlorohexyl phthalate, diphenyl phthalate, triphenyl phosphate, dimethyl fumurate, benzotriazole, 2,4-dihydroxy benzophenone, tribenzylamine, Bengal, vanillin, and phthalophenone. Another useful material of this type is "Santicizer™ 9", a mixture of ortho- and para-toluene sulfonamides commercially available from the Monsanto Chemical Company. Mixtures of these materials are also useful. The supercooling material can also consist of two or more materials that are not supercooling by themselves, but are recombinable to form a supercooling material. Preferably the supercooling material is capable of volatilizing completely and efficiently at temperatures between approximately 600° C. to 900° C., preferably between approximately 750° to 850° C. The amount of non-volatilized materials is minimized to eliminate interference with the conductivity of the fused conductive metal. The acceptable levels of non-volatilized supercooling materials is determined by firing the construction after toning with a conductive metal and measuring the conductivity of the fused conductive metal. The amount of residual supercooling materials after firing the construction is preferably less than 7.5%, more preferably less than 5.0%, and most preferably less than 1.0%.

The compositions of the invention preferably comprise at least 60% supercooling material. When absorbing dyes are used, they should comprise at least 0.00025 wt. % solids of the layer. Inert binders, particulate coating aids, and other adjuvants, such as silica and silcone derivatives, may also be present. The supercoolant material is usually present between 60–99.5% solids, more preferably between 75–99.5% solids. The absorbing dye is generally present between 0.00025 and 2% by weight of the dry layer, more preferably between 0.0005 and 1.5%.

Infrared absorbing dyes which convert infrared radiation to heat or other wavelength absorbing dyes which can convert radiation to heat are well known in the art and are widely available commercially. Merocyanine, cyanine, and tricarbocyanine dyes are the most readily available generic classes of infrared absorbing dyes, and those within those classes in the heptamethine series, and oxazoles, benzoxazoles, 2-quinolines, 4-quinolines, benzothiazoles, indolinenes, thiazoles, squariliums, etc. tend to be the most preferred. Examples of these types of dyes may be found in the general literature such as *The Theory of the Photographic Process*, Mees and James, Third Edition, 1996; *Cyanine Dye*, Venkataraman, 2d Edition, 1963; and extensively in patent literature such as U.S. Pat. Nos. 5,041,550, 4,784,933, 3,194,805, 4,619,892, 5,013,622, and 5,245,045. Essentially any dye which efficiently absorbs radiation and converts it to heat can be used in the practice of the present invention. Efficiency is merely a physical matter indicating that enough energy is absorbed and converted to heat to drive the process of melting the composition. With higher energy imaging sources (e.g., gas lasers), the efficiency can be much lower than with lower energy sources (e.g., light emitting diodes).

A fluorocarbon surfactant may optionally be included with the supercooled material to facilitate the contact efficiency between the imaged supercooled areas and the conductive metallic toner. Fluorocarbon surfactants are materials well known in the art and are commercially available. These types of surfactants are widely reported in the patent literature, as for example in U.S. Pat. Nos. 2,759,019, 2,764,602, 3,589,906 and 3,884,699, Belgian Patent No. 739,245, and French Patent No. 2,025,688. These fluorinated surfactant compounds ordinarily comprise at least one highly fluorinated chain carried with an ionic or ionizable group although they may be nonionic in certain environments. A "highly fluorinated" group according to the practice of the present invention is a group wherein a substantial portion of hydrogen atoms attached to carbon atoms have been replaced with fluorine atoms. Preferably the highly fluorinated group contains an average of more than 1.75 fluorine atoms per carbon atom within a single chain on the compound. More preferably, remaining hydrogens on the chain (which have not been replaced with fluorine) are replaced by chlorine. More preferably, within an alkyl chain (including, but less preferably cycloalkyl) there are at least 2.0 fluorine atoms per carbon atom in the chain, and most preferably the group contains a perfluorinated alkyl chain. The perfluorinated group may be perfluoromethyl, perfluoroethyl, perfluoropropyl, perfluorobutyl, etc., preferably having five or more carbon atoms within each perfluorinated chain, with $C_5$–$C_{20}$ being preferred for the highly fluorinated groups. The fluorinated surfactant may be present in the supercooled composition from between 0.01 to 6% by weight solids of the non-metallic layer, more preferably between 0.05 to 5% by weight solids of the layer, and most preferably between 0.1 to 4% by weight solids.

The non-metallic layer of the present invention may also contain particulate materials in the composition to prevent blocking between contacting elements. Matting agents such as silica, acrylates (e.g., polymethylmethacrylate polymers and copolymer beads), polystyrene, titanium oxide, polytetrafluoroethylene and the like may be used for this purpose. The matting agents should roughen the surface of the composition and can provide the additional function of dispersing the coherent radiation, thereby reducing fringes and other optical effects associated with lasers. These particulates may be present in amounts from 0.01 to 7.5% by weight of the composition layer, preferably in an amount of from 0.1 to 5% by weight solids of that layer.

The laser addressable element is exposed with a coherent radiation source. The coherent source may be a laser or a laser diode. Laser diodes are particularly useful due to their compactness and flexibility in designing automated imaging equipment, such as CAD systems. Suitable coherent radiation sources include visible, ultraviolet, infrared and near-infrared light emitting sources. Preferred coherent radiation sources are infrared or near-infrared radiation sources, which include substantially any laser capable of generating light in the infrared and near-infrared region of the electromagnetic spectrum 750 to 1100 nm, including dye lasers; solid state diode lasers such as aluminum gallium arsenide diode lasers that emit in the region of 780 to 870 nm; and diode pumped solid state lasers such as Nd:YAG, Nd:YLF, or Nd:Glass.

The imaged element is toned with a conductive toner. The toner may be liquid or a dry powder, preferably a dry powder. A variety of conductive metals may be used in the toner for example, gold, silver, copper, indium, lead, tin, nickel, aluminum, antimony, arsenic, bismuth, cadmium, gallium, germanium, silicon, palladium and any combination thereof.

The conductive toner may be applied by a variety of methods, such as spraying, sprinkling, brushing, squeegee, roller, etc. Once the conductive toner is absorbed or adhered to the supercooled areas (exposed areas) of the imaged element, then the element is heated in a furnace to remove substantial amounts of the non-metallic materials and to fuse the conductive metal. Preferably greater than 99.0% of the non-metallic materials are removed, more preferably greater than 99.5% and most preferably greater then 99.9%. A muffle furnace is typically used; however any furnace capable of heating the imaged element to temperatures sufficient to remove substantial amounts of the non-metallic materials and fuse the conductive metal may be used. The imaged element is typically heated to a temperature between about 600° C. to 900° C., preferably 750° C. to 850° C., for approximately 5 to 45 minutes. The temperatures and times will vary depending upon the particular conductive metal and non-metallic materials used, and the transport speed through the furnace.

These and other aspects of the present invention will become apparent from the following, non-limiting examples.

EXAMPLES

The following Examples illustrate a process of forming a conductive metal on a ceramic substrate using an infrared laser diode. The infrared dye IR-125 used in the following examples has the following structure and is available from Eastman Kodak Co, Rochester, N.Y.

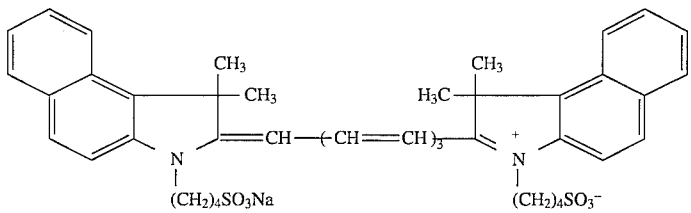

10

Example 1

The following coating solution was coated onto an AL-203 substrate (96% Alumina, available from Coors Ceramics Co., Golden, Colo.) at a wet thickness of 5 mils (0.13 mm) and allowed to dry at room temperature for 25 hours.

| | |
|---|---|
| Dichlorohexylphthalate (available from Aldrich Chemical Co., Milwaukee, WI) | 21.0 g |
| Ethocel ™ N200 (ethyl cellulose available from Dow Chemical USA, Midland, MI) | 3.0 g |
| Acetone | 77.0 g |
| Syloid ™ 244 (available from W.R. Grace & Co., Baltimore, MD) | 2.0 g |
| IR-125 dye | 0.2 g |

The laser addressable element was exposed with a 100 milliwatt laser diode having a maximum wavelength at 820 nanometers. A conductive metallic dry powder containing 80% silver and 20% palladium (#1120.2.8F metallic powder available from Metz Metallurgical Corporation, South Plainfield, N.J.) was brushed onto the imaged areas of the element using an artist brush. The element was then fired in a muffle furnace at 850° C. for 10 minutes. The resultant conductive metallic line image had a thickness of 37 microns.

Example 2

The following coating solution was coated onto an AL-203 substrate (96% Alumina, available from Coors Ceramics Co., Golden, Colo.) at a wet thickness of 5 mils (0.13 mm) and allowed to dry at room temperature for 25 hours.

| | |
|---|---|
| Dichlorohexylphthalate (20% solution in methyl ethyl ketone) | 5.0 g |
| Methanol | 1 mL |
| MEK-ST (30% total solids amorphous silica in methyl ethyl ketone, available from Nissan Chemical Industries, Ltd., Tokyo, Japan) | 1.0 g |
| IR-125 dye | 0.1 g |

The laser addressable element was exposed with a 100 milliwatt laser diode having a maximum wavelength at 820 nanometers. A conductive metallic dry powder containing 80% silver and 20% palladium (#1120.2.8F metallic powder available from Metz Metallurgical Corporation, South Plainfield, N.J.) was brushed onto the imaged areas of the element using an artist brush. The element was then fired in a muffle furnace at 850° C. for 10 minutes. The resultant conductive metallic line image had a thickness of 30 microns.

Example 3

The following coating solution was coated onto an AL-203 substrate (96% Alumina, available from Coors Ceramics Co., Golden, Colo.) at a wet thickness of 5 mils (0.13 mm) and allowed to dry at room temperature for 25 hours.

| | |
|---|---|
| Dichlorohexylphthalate (20% solution in methyl ethyl ketone) | 5.0 g |
| Methanol | 1 mL |
| MEK-ST (30% total solids amorphous silica in methyl ethyl ketone) | 1.0 g |
| FC-431 (fluorinated surfactant, available from 3M, St. Paul, MN) | 0.2 g |
| IR-125 dye | 0.1 g |

The laser addressable element was exposed with a 100 milliwatt laser diode having a maximum wavelength at 820 nanometers. A conductive metallic dry powder containing 80% silver and 20% palladium (#1120.2.8F metallic powder) was brushed onto the imaged areas of the element using an artist brush. The element was then fired in a muffle furnace at 850° C. for 10 minutes. The resultant conductive metallic line image had a thickness of 30 microns.

Example 4

The following coating solution was coated onto an AL-203 substrate (96% Alumina, available from Coors Ceramics Co., Golden, Colo.) at a wet thickness of 5 mils (0.13 mm) and allowed to dry at room temperature for 25 hours.

| | |
|---|---|
| Dichlorohexylphthalate (20% solution in methyl ethyl ketone) | 5.0 g |
| Methanol | 1 mL |
| MEK-ST (30% total solids amorphous silica in methyl ethyl ketone) | 1.0 g |
| Silicone diamine* | 0.3 g |
| IR-125 dye | 0.1 g |

*The silicone diamine was prepared as described in Example 2 of EP Application 0 250 248. Bis(3-aminopropyl)tetramethyldisiloxane was condensed with octamethylcyclotetrasiloxane at 80° C. using 3-aminopropyl dimethyl tetramethylammonium silanolate as a catalyst giving rise to a silicone diamine having a molecular weight of 10,000.

*The silicone diamine was prepared as described in Example 2 of EP Application 0 250 248. Bis(3-aminopropyl)tetramethyldisiloxane was condensed with octamethylcyclotetrasiloxane at 80° C. using 3-aminopropyl dimethyl tetramethylammonium silanolate as a catalyst giving rise to a silicone diamine having a molecular weight of 10,000.

The laser addressable element was exposed with a 100 milliwatt laser diode having a maximum wavelength at 820 nanometers. A conductive metallic dry powder containing 80% silver and 20% palladium (#1120.2.8F metallic powder) was brushed onto the imaged areas of the element using an artist brush. The element was then fired in a muffle furnace at 850° C. for 10 minutes. The resultant conductive metallic line image had a thickness of 30 microns.

What is claimed:

1. A process for providing a conductive metallic image on a substrate comprising the sequential steps of:
   i) providing a laser addressable element comprising said substrate having on at least one surface thereof a non-metallic layer comprising a) a solid binder which can be converted to a supercooled liquid upon exposure with a coherent radiation source and subsequent cooling to room temperature, b) a radiation absorbing dye capable of converting radiation from said coherent radiation source to heat, and c) an optional fluorinated surfactant;

ii) exposing said laser addressable element with said coherent radiation source to form an imagewise pattern of said supercooled liquid;

iii) applying to said imagewise pattern a metallic toner comprising a conductive metal; and iv) heating said laser addressable element to remove greater than 99% of said non-metallic layer and to fuse said conductive metal leaving a conductive metal image on said substrate.

2. The process of claim 1 wherein said metallic toner is a conductive dry powder.

3. The process of claim 1 wherein said metallic toner is a liquid toner.

4. The process of claim 1 wherein said coherent radiation source is capable of generating radiation in the range from 750 to 1100 nanometers.

5. The process of claim 1 wherein said conductive metal is selected from the group consisting of gold, silver, copper, indium, lead, tin, nickel, aluminum, antimony, arsenic, bismuth, cadmium, gallium, germanium, silicon, palladium and any combination thereof.

6. The process of claim 1 wherein said substrate is ceramic.

7. A process for providing a conductive metallic image on a substrate comprising the sequential steps of:

i) providing a laser addressable element comprising said substrate having on at least one surface thereof a non-metallic layer comprising a) a solid binder which can be converted to a supercooled liquid upon exposure with a coherent radiation source having a radiation output between 750 and 1100 nanometers and subsequent cooling to room temperature, b) an infrared absorbing dye capable of converting radiation from said coherent infrared radiation source to heat, and c) an optional fluorinated surfactant;

ii) exposing said laser addressable element with said coherent infrared radiation source to form an imagewise pattern of said supercooled liquid;

iii) applying to said imagewise pattern a dry metallic powder comprising a conductive metal; and iv) heating said laser addressable element between 700° C. and 900° C. to remove greater than 99% of said non-metallic layer and to fuse said conductive metal leaving a conductive metal image on said substrate.

8. The process of claim 7 wherein said conductive metal is selected from the group consisting of gold, silver, copper, indium, lead, tin, nickel, aluminum, antimony, arsenic, bismuth, cadmium, gallium, germanium, silicon, palladium and any combination thereof.

9. The process of claim 7 wherein said metallic toner is a conductive dry powder.

10. The process of claim 7 wherein said substrate is ceramic.

* * * * *